United States Patent
Lin et al.

(10) Patent No.: US 9,059,519 B2
(45) Date of Patent: Jun. 16, 2015

(54) MIMO ANTENNA DEVICE, ANTENNA AND ANTENNA PACKAGE

(75) Inventors: Ken-Huang Lin, Kaohsiung (TW); Tzyy-Sheng Horng, Kaohsiung (TW); Tzu-Chun Tang, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 409 days.

(21) Appl. No.: 13/608,922

(22) Filed: Sep. 10, 2012

(65) Prior Publication Data

US 2013/0321234 A1 Dec. 5, 2013

(30) Foreign Application Priority Data

May 30, 2012 (TW) .............................. 101119355 A

(51) Int. Cl.
*H01Q 21/00* (2006.01)
*H01Q 21/28* (2006.01)
*H01Q 9/04* (2006.01)

(52) U.S. Cl.
CPC ........... *H01Q 21/28* (2013.01); *H01Q 21/0075* (2013.01); *H01Q 9/0442* (2013.01); *H01Q 9/045* (2013.01)

(58) Field of Classification Search
CPC .. H01Q 1/2283; H01Q 9/0407; H01Q 9/0414
USPC .......... 343/700 MS, 702, 720, 741, 742, 855, 343/866, 867
See application file for complete search history.

(56) References Cited

U.S. PATENT DOCUMENTS

| | | | |
|---|---|---|---|
| 5,568,156 A | * | 10/1996 | Terashima et al. ............. 343/713 |
| 6,239,752 B1 | | 5/2001 | Blanchard |
| 6,373,447 B1 | | 4/2002 | Rostoker et al. |
| 6,426,723 B1 | | 7/2002 | Smith et al. |
| 6,770,955 B1 | | 8/2004 | Coccioli et al. |
| 6,818,985 B1 | | 11/2004 | Coccioli et al. |
| 6,914,566 B2 | | 7/2005 | Beard |
| 7,342,299 B2 | | 3/2008 | Gaucher et al. |
| 7,352,056 B2 | | 4/2008 | Wu |
| 7,352,328 B2 | | 4/2008 | Moon et al. |
| 7,408,511 B2 | | 8/2008 | Liu |

(Continued)

FOREIGN PATENT DOCUMENTS

| | | |
|---|---|---|
| TW | M418410 | 12/2001 |
| TW | M349047 | 1/2009 |

(Continued)

*Primary Examiner* — Hoang V Nguyen
*Assistant Examiner* — Patrick Holecek
(74) *Attorney, Agent, or Firm* — Muncy, Geissler, Olds & Lowe, P.C.

(57) ABSTRACT

A multi-input and multi-output antenna device is disclosed. The MIMO antenna device comprises two antennas symmetrically disposed on a substrate. Each antenna comprises a T-shaped feeding unit, a radiation unit and a ground unit. The T-shaped feeding unit and the radiation unit are disposed on a first surface of the substrate. The T-shaped feeding unit forms a strip portion and a top portion. The radiation unit has first and second ends. The radiation unit extends from the first end to the second end to form a rectangular region and a spacing. The first end extends parallel to the top portion. The ground unit is disposed along two sides of the strip portion and electrically coupled to the second end. The two strip portions of the two T-shaped feeding units are parallel to and aligned with each other. The two ground units are electrically connected to each other.

12 Claims, 9 Drawing Sheets

(56) References Cited

U.S. PATENT DOCUMENTS

| | | |
|---|---|---|
| 7,411,554 B2 | 8/2008 | Jung et al. |
| 7,460,069 B2 | 12/2008 | Park et al. |
| 7,473,433 B2 | 1/2009 | Weikert et al. |
| 7,692,590 B2 | 4/2010 | Floyd et al. |
| 7,791,539 B2 | 9/2010 | Soler Castany et al. |
| 7,812,768 B2 | 10/2010 | Liu et al. |
| 7,880,677 B2 | 2/2011 | Rofougaran et al. |
| 7,944,038 B2 | 5/2011 | Chiu et al. |
| 8,058,714 B2 | 11/2011 | Noll et al. |
| 8,085,202 B2 | 12/2011 | Ayatollahi et al. |
| 2009/0009400 A1 | 1/2009 | Kim et al. |
| 2009/0219213 A1* | 9/2009 | Lee et al. ............... 343/700 MS |

FOREIGN PATENT DOCUMENTS

| | | |
|---|---|---|
| TW | I316310 | 10/2009 |
| TW | 201205957 | 2/2012 |
| TW | I348250 | 2/2012 |

* cited by examiner

MIMO ANTENNA DEVICE, ANTENNA AND ANTENNA PACKAGE

BACKGROUND OF THE INVENTION

1. Field of the Invention

The present invention generally relates to a MIMO antenna device and an antenna package having the MIMO antenna device and, more particularly, to a MIMO antenna device that includes two antennas having a low correlation between the two antennas, as well as an antenna package having the MIMO antenna device.

2. Description of the Related Art

System in Package (SiP) technology has been widely used in multi-mode wireless communication products to integrate semiconductor chips with passive elements. As an example, passive elements such as electronic circuits, antennas and connectors are integrated as an integrated passive device (IPD) via semiconductor manufacturing technology.

As the demanded wireless transmission data rates continue to grow in the latest wireless communication technologies, such as Long-term evolution (LTE) and WiMAX, the conventional single-input and single-output (SISO) antenna technology is not a preferred choice to the users due to the limited channel capacity. In light of this, multi-input and multi-output (MIMO) antenna technology was proposed to replace the SISO antenna technology. The MIMO antenna technology allows multiple signals that are transmitted by emitting ends to be received through multiple receiving ends, significantly increasing the data throughput. Thus, the spectrum efficiency can be improved without increasing the bandwidth and the noise-signal ratio. In addition, antenna correlation is proportional to the $S_{21}$ parameter and can be lowered by enhancing the antenna isolation. However, the MIMO antenna technology still has some drawbacks.

For instance, the antenna technologies disclosed in Taiwan Patent Publication No. 200952251 and U.S. Pat. Nos. 6,770,955, 8,058,714 and 7,944,038 are suitable for use in a single-antenna environment only. The antenna technology disclosed in Taiwan Patent No. M349047 is criticized for inconvenient integration of the antenna and the IC modules. In the antenna technologies disclosed in U.S. Pat. Nos. 6,239,752, 6,373,447, 6818985 and 6914566, the electromagnetic distributions between the antenna and the IC chip are not shown and described, making it difficult to obtain the actual isolation between the antenna and the IC chip. The antenna technology disclosed in U.S. Pat. Nos. 7,342,299, 7,352,056, 7,791,539, 7,880,677, 6,426,723, 7,408,511, 7,411,554, 7,473,433, 8,085,202 and 7,812,768, as well as in Taiwan Patent No. 1316310, cannot be used in a small-sized package system since the antennas take up (or occupy) larger spaces when the operational frequency is lower. In the antenna technologies disclosed in U.S. Pat. No. 7,408,511 and Taiwan Patent Nos. M418410, 1348250 and 201205957, the correlations of the antennas must be maintained by changing the antenna placement, increasing the ground areas of the antennas, keeping a certain gap between the antennas, or using decoupling circuits. In the antenna technologies disclosed in U.S. Pat. Nos. 7,352,328, 7,460,069 and 20090009400, the antenna isolations are maintained only when the antennas have certain gaps or when isolation devices are used.

In summary, apart from the disadvantages that the conventional antenna technologies require larger package dimensions and cannot be used in a multi-antenna environment, the conventional antenna technologies also have another disadvantage that the correlations or isolations of the antennas are maintained only by changing the antenna placement, increasing the ground areas of the antenna, or using the decoupling circuits or the isolation devices. This results in an inconvenient usage.

Thus, it is necessary to overcome the above problems by providing a MIMO antenna device that dose not require the match circuits, takes up a smaller space and has an outstanding isolation.

SUMMARY OF THE INVENTION

It is therefore the objective of this invention to provide a MIMO antenna device and an antenna package having the MIMO antenna device, in which isolation devices are not required due to the fact that weak current is induced on the other antenna unit. As a result, outstanding isolation is achieved.

It is another objective of this invention to provide a MIMO antenna device and an antenna package having the MIMO antenna device, in which the antenna areas are independent from the operational frequency due to the fact that the energy can be coupled from the T-shaped feeding unit to the radiation unit. As a result, miniaturization of the antennas is achieved.

It is another objective of this invention to provide a MIMO antenna device and an antenna package having the MIMO antenna device, in which the operational frequency of the antennas can be adjusted by simply changing the geometrical structures of the T-shaped feeding unit and the radiation unit without using the match circuit.

In a preferred embodiment of the invention, a multi-input and multi-output (MIMO) antenna device is disclosed. The MIMO antenna device comprises two antennas that are symmetrically disposed on a substrate. Each antenna comprises a T-shaped feeding unit, a radiation unit and a ground unit. The T-shaped feeding unit and the radiation unit are disposed on a first surface of the substrate. The T-shaped feeding unit forms a strip portion and a top portion. The radiation unit has a first end and a second end. The radiation unit extends from the first end to the second end to form a rectangular region and a spacing. The first end of the radiation unit extends parallel to the top portion of the T-shaped feeding unit. The ground unit is disposed along two sides of the strip portion and electrically coupled to the second end of the radiation unit. The two strip portions of the two T-shaped feeding units are parallel to and aligned with each other. The two ground units of the two antennas are electrically connected to each other.

In a preferred form shown, the ground unit is disposed on a second surface of the substrate and arranged in parallel along two sides of the strip portion.

In the preferred form shown, each antenna further comprises an impedance adjustment unit positioned in the rectangular region. The impedance adjustment unit comprises a first section and a second section. The first section extends away from the top portion in a direction perpendicular to the top portion, the second section extends parallel to the top portion towards the spacing.

In the preferred form shown, the radiation unit is spaced from the top portion by a coupling gap.

In the preferred form shown, the strip portion has a thick section and a thin section. The thin section is connected between the thick section and the top portion.

In the preferred form shown, the radiation unit comprises a first strip, a second strip, a third strip and a fourth strip. The first strip, the second strip, the third strip and the fourth strip jointly form the rectangular region. The first strip and the fourth strip are spaced from each other by the spacing.

In the preferred form shown, each antenna further comprises an impedance adjustment unit positioned in the rectangular region. The impedance adjustment unit comprises a first section and a second section. The first section is connected between the first strip and the second section and is perpendicular to the first strip and the second section. The second section extends towards the fourth strip.

In the preferred form shown, the first strip is spaced from the top portion by the coupling gap.

In the preferred form shown, the two second strips of the two antennas are spaced from each other by a predetermined distance.

In the preferred form shown, the ground unit comprises first and second ground sections arranged in parallel along two sides of the strip portion. The first ground section is electrically coupled to the radiation unit, the two second ground sections of the two antennas are electrically coupled to each other.

In the preferred form shown, the ground unit comprises a plurality of ground pads, a first ground section and a second ground section. The ground pads are disposed on the first surface of the substrate. The first and second ground sections are disposed on a second surface of the substrate and arranged in parallel along two sides of the strip portion. Each ground pad is aligned with a corresponding one of the first and second ground sections. A portion of the ground pads and the first ground section are electrically coupled with each other and arranged on one side of the strip portion. The other portion of the ground pads and the second ground section are electrically coupled with each other and arranged on the other side of the strip portion.

In the preferred form shown, the radiation unit is electrically coupled to the ground unit via a conducting member and a conducting pad. The conducting member extends from the first surface to the second surface. The conducting pad is disposed on the first surface.

In another preferred embodiment of the invention, an antenna is disclosed. The antenna comprises a T-shaped feeding unit, a radiation unit and a ground unit. The T-shaped feeding unit forms a strip portion and a top portion on a first surface of a substrate. The radiation unit is disposed on the first surface and has a first end and a second end. The radiation unit extends from the first end to the second end to form a rectangular region and a spacing. The radiation unit partially extends parallel to the top portion of the T-shaped feeding unit. The ground unit is disposed along two sides of the strip portion and electrically coupled to the second end of the radiation unit.

In another preferred embodiment of the invention, an antenna package is disclosed. The antenna package comprises a carrying unit, at least one antenna and at least one circuit unit. The carrying unit comprises a base plate, a substrate and a cover plate being stacked. The base plate has a first ground pad. The cover plate has a second ground pad electrically coupled to the first ground pad. Each of the at least one antenna comprises a T-shaped feeding unit, a radiation unit and a ground unit. The T-shaped feeding unit and the radiation unit are sandwiched between the substrate and the cover plate. The T-shaped feeding unit forms a strip portion and a top portion. The radiation unit has a first end and a second end. The radiation unit extends from the first end to the second end to form a rectangular region and a spacing. The first end of the radiation unit extends parallel to the top portion of the T-shaped feeding unit. The ground unit is disposed along two sides of the strip portion. The ground unit is electrically coupled to the second end of the radiation unit and the second ground pad of the carrying unit. The at least one circuit unit is mounted on the cover plate and electrically coupled to the second ground pad of the carrying unit and the ground unit of each antenna.

In a preferred form shown, the radiation unit is electrically coupled to the ground unit via a first conducting member. The ground unit is electrically coupled to the second ground pad via a plurality of second conducting members and a plurality of third conducting members. The first conducting member and the second conducting members extend through the substrate. The third conducting members extend through the cover plate.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
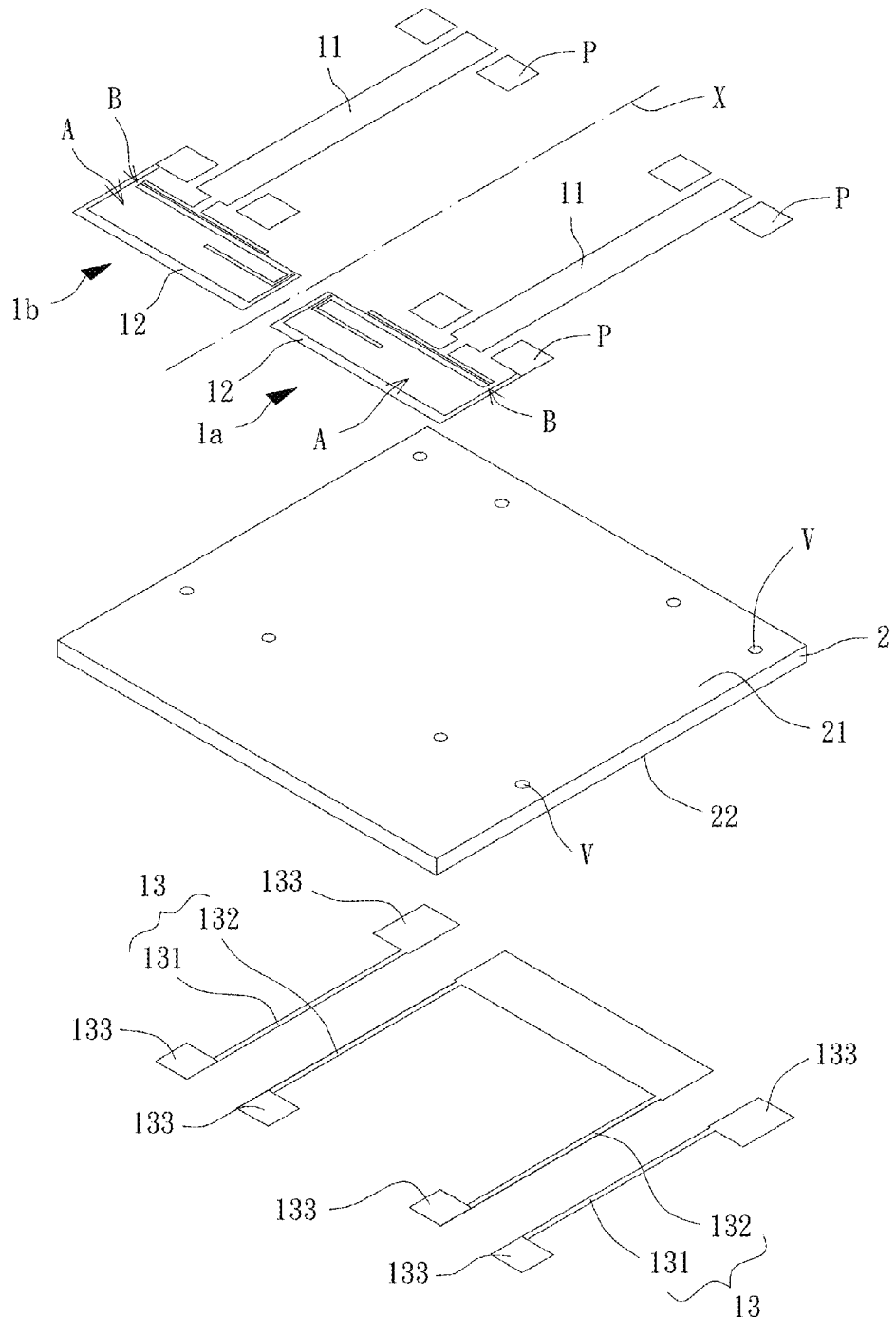
FIG. 1 is an exploded view of a MIMO antenna device according to a preferred embodiment of the invention.

In the various figures of the drawings, the same numerals designate the same or similar parts. Furthermore, when the terms "first", "second", "third", "fourth", "inner", "outer" "top", "bottom", "front", "rear" and similar terms are used hereinafter, it should be understood that these terms have reference only to the structure shown in the drawings as it would appear to a person viewing the drawings, and are utilized only to facilitate describing the invention.

DETAILED DESCRIPTION OF THE INVENTION

Figure 2:
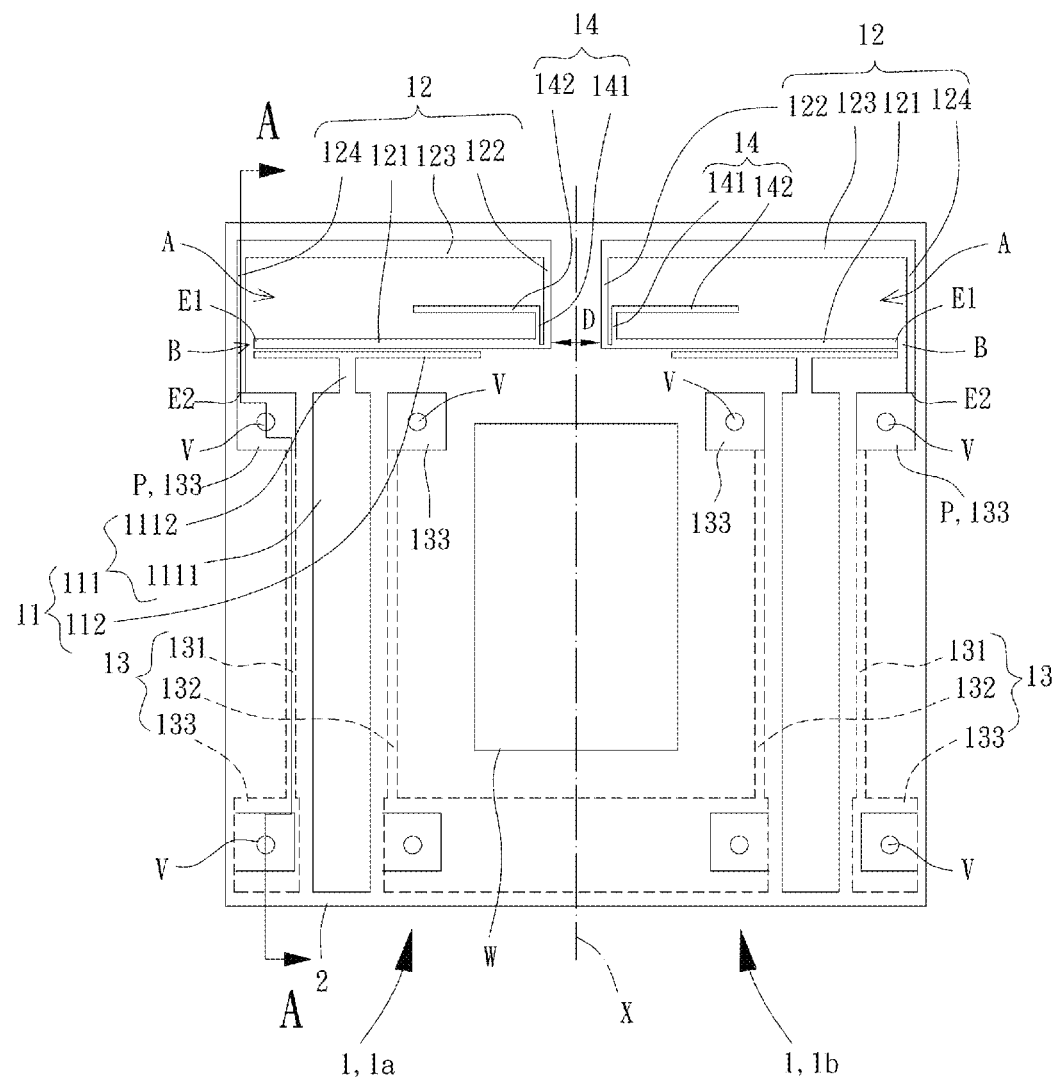
FIG. 2 is a top view of the MIMO antenna device of the preferred embodiment of the invention.
Figure 3:
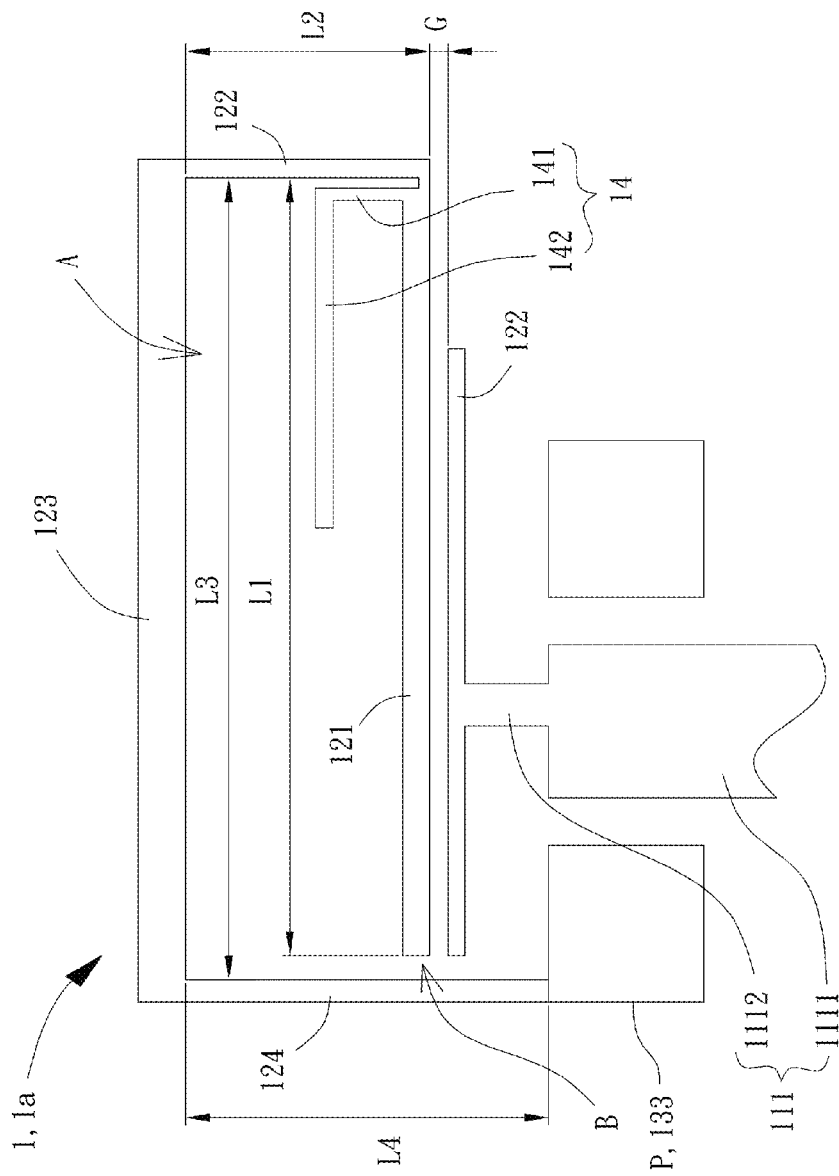
FIG. 3 is a partially enlarged view of the MIMO antenna device shown in FIG. 2.

Referring to FIGS. 1 to 3, a MIMO antenna device is disclosed according to a preferred embodiment of the invention. The MIMO antenna device includes a plurality of antennas 1 and a substrate 2. Any two adjacent antennas 1 of the plurality of antennas 1 are symmetric with respect to an axis X. The antennas 1 can be disposed on the substrate 2. The substrate 2 is made of insulation material such as polyimide and comprises two opposite surfaces 21 and 22 for placement of the antennas 1.

The antennas 1 are made of material with electricity conductivity, such as metal. The antennas 1 are shown to consist of two antennas 1a and 1b in the embodiment for illustration purposes. However, the antennas 1 may include an even or odd number of antennas 1. Under the specific layout of the antennas 1 shown in FIG. 1, the two antennas 1a and 1b have low correlation and high isolation therebetween, as elaborated later in the specification.

Each antenna 1 has a T-shaped feeding unit 11, a radiation unit 12 and a ground unit 13. The T-shaped feeding unit 11 forms a strip portion 111 and a top portion 112 on the surface 21 or 22. The strip portions 111 of the T-shaped feeding units 11 are parallel to and aligned with each other. In this embodiment, the strip portions 111 of the T-shaped feeding units 11 are arranged on the surface 21, but are not limited thereto. Specifically, the strip portions 111 of the T-shaped feeding units 11 extend parallel to each other along the axis X. The strip portion 111 has a thick section 1111 and a thin section 1112. The thin section 1112 is connected between the thick section 1111 and the top portion 112. The top portion 112, the thick section 1111 and the thin section 1112 resemble the shape of "T". Energy may be coupled from the T-shaped feeding unit 11 to the other part of the antenna 1 (such as the radiation unit 12). Impedance matching may be accomplished when the thin section 1112 has a smaller width than the thick section 1111.

Referring to FIGS. 1 to 3 again, the radiation unit 12 has a first end E1 extending parallel to the top portion 112. The radiation unit 12 extends in a labyrinthine manner to form a rectangular region A and a gap B. The radiation unit 12 has a second end E2 electrically connected to the ground unit 13. Specifically, the radiation unit 12 and the T-shaped feeding unit 11 are disposed on the same surface of the substrate 2 (such as the surface 21, for example). The radiation unit 12 is spaced from the top portion 112 of the T-shaped feeding unit 11 by a coupling gap G (as shown in FIG. 3), forming an equivalent capacitor between the radiation unit 12 and the T-shaped feeding unit 11. Therefore, electrical signals can be transferred from the T-shaped feeding unit 11 to the radiation unit 12 by electrical coupling. Currents on the T-shaped feeding unit 11 may generate an electromagnetic field which interacts with an equivalent inductor formed on the rectangular region A of the radiation unit 12, resulting in a resonance of the radiation unit 12. As such, the radiation unit 12 radiates energy based on the resonance. Similarly, electromagnetic field also induces currents on the radiation unit 12 when electrical signals are to be received. The coupling gap G may be changed to adjust the operational frequency as required. In the embodiment, the coupling gap G is implemented in a predetermined value corresponding to the operational frequency of 5.1 GHz to 5.85 GHz, but is not limited thereto.

Figure 4A:
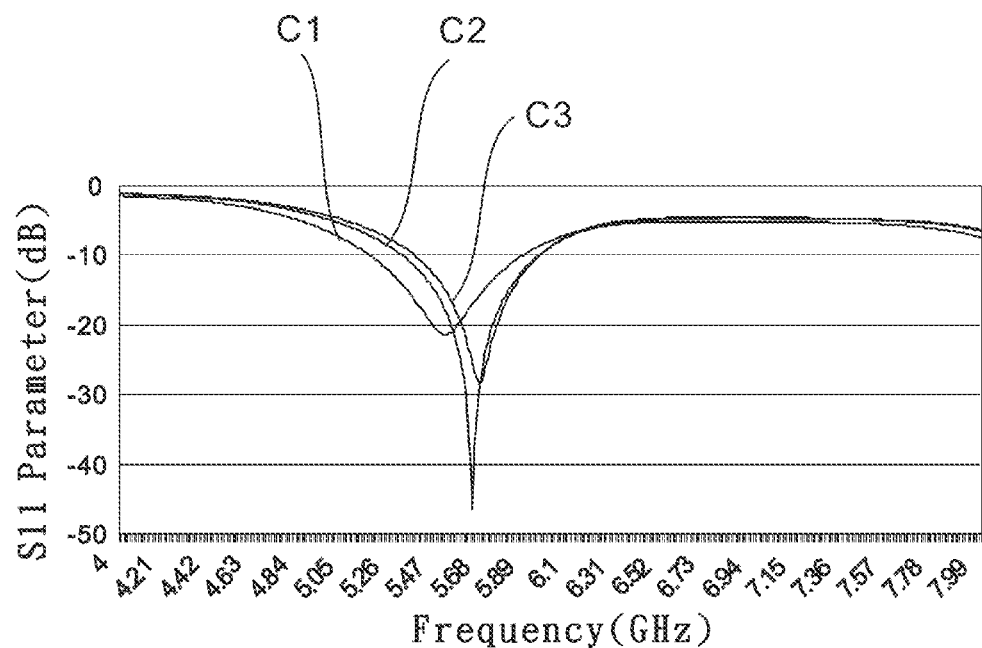
FIG. 4a shows the frequency responses of $S_{11}$ parameter of the MIMO antenna device with respect to different coupling gaps.

FIG. 4a shows the frequency responses of the $S_{11}$ parameter of the MIMO antenna device with respect to different coupling gaps G. Line C1 represents the frequency response of the $S_{11}$ parameter of the MIMO antenna device when the coupling gap G is 20 μm, line C2 represents the frequency response of the $S_{11}$ parameter when the coupling gap G is 30 μm, and line C3 represents the frequency response of the $S_{11}$ parameter when the coupling gap G is 40 μm. The bandwidths of individual lines C1, C2 and C3 can be determined based on the difference in operational frequency when the $S_{11}$ value is at −10 dB. It can be recognized from FIG. 4a that the line C1 has the largest bandwidth. Therefore, the preferred coupling gap G is 20 μm. When the coupling gap G is 20 μm, a reactance with proper value is provided for compensation of the imaginary part of the antenna impedance, achieving improved impedance matching.

Specifically, the radiation unit 12 may include a first strip 121, a second strip 122, a third strip 123 and a fourth strip 124. The first strip 121, the second strip 122, the third strip 123 and the fourth strip 124 jointly form the rectangular region A. The first strip 121 and the fourth strip 124 are spaced from each other by the gap B, forming the equivalent inductor of the radiation unit 12. The first strip 121 has the first end (the end E1) facing the fourth strip 124 and spaced from the fourth strip 124 by the gap B. The first strip 121 and the top portion 112 are spaced from each other by the coupling gap G as shown in FIG. 3. In this embodiment, the rectangular region A has a predetermined area corresponding to the operational frequency of 5.1 GHz to 5.85 GHz. However, the rectangular region A may have different areas corresponding to different operational frequencies.

Figure 4B:
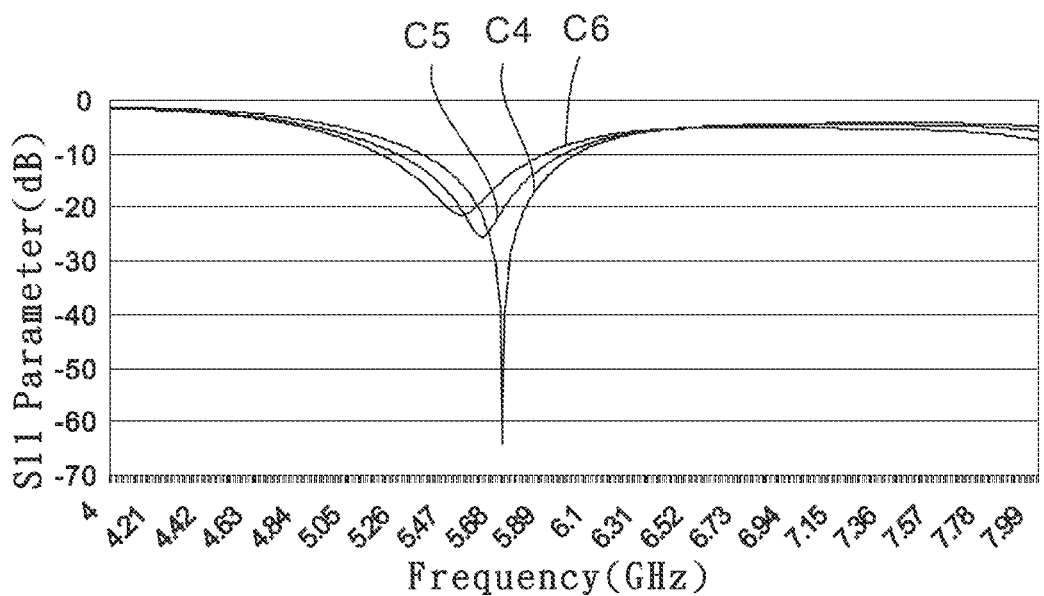
FIG. 4b shows the frequency responses of $S_{11}$ parameter of the MIMO antenna device with respect to different areas of the rectangular regions.

FIG. 4b shows the frequency responses of the $S_{11}$ parameter of the MIMO antenna device with respect to different areas of the rectangular region A. Line C4 represents the frequency response of the $S_{11}$ parameter of the MIMO antenna device when the rectangular region A has an area of 1.7×0.09 mm$^2$, line C5 represents the frequency response of the $S_{11}$ parameter when the rectangular region A has an area of 1.7×0.29 mm$^2$, and line C6 represents the frequency response of the $S_{11}$ parameter when the rectangular region A has an area of 1.7×0.49 mm$^2$. The bandwidths of individual lines C4, C5 and C6 can be determined based on the difference in operational frequency when the $S_{11}$ value is at −10 dB. It can be seen from FIG. 4b that the line C6 has the largest bandwidth. Therefore, the preferred area of the rectangular region A is 1.7×0.49 mm$^2$.

Due to the specific layout of the antennas 1, the isolation of the antennas 1 can be maintained, the electromagnetic interferences between the antennas 1 and the peripheral electronic components (such as passive elements, integrated circuits or other circuits) can be prevented by simply keeping the second strips 122 of two adjacent antennas 1 (such as the antennas 1a and 1b) in a predetermined distance D. The required distance D in the embodiment is much shorter than it is required in the conventional antennas under the same operational frequency. As an example, if the operational frequency is 5 GHz, the required distance D in this embodiment is only 0.3 mm, whereas the required distance in the conventional antennas is as long as one quarter of wavelength $$\left(\frac{1}{4}\lambda\right),$$

which is 15 mm in this case.

Area W between two T-shaped feeding units 11 of two adjacent antennas 1 experiences a relatively weaker electromagnetic field, as shown in FIG. 2. Thus, when the peripheral circuits (integrated circuits or passive elements) are disposed in the area W, the peripheral circuits experience a lesser extent of electromagnetic interference.

Based on the equivalent inductor formed by the radiation unit 12, the currents on the third strip 123 interact with the equivalent inductor when the radiation unit 12 receives energy from the T-shaped feeding unit 11, thereby generating electromagnetic field and radiating energy. The third strip 123 has a length L3 that is larger than the length L1 of the first strip 121. The fourth strip 124 has a length L4 that is larger than the length L2 of the second strip 122. In this embodiment, the lengths L3 and L4 are implemented in certain values corresponding to the operational frequency of 5.1 GHz to 5.85 GHz. However, the lengths L3 and L4 can have other values corresponding to another operational frequency.

Figure 4C:
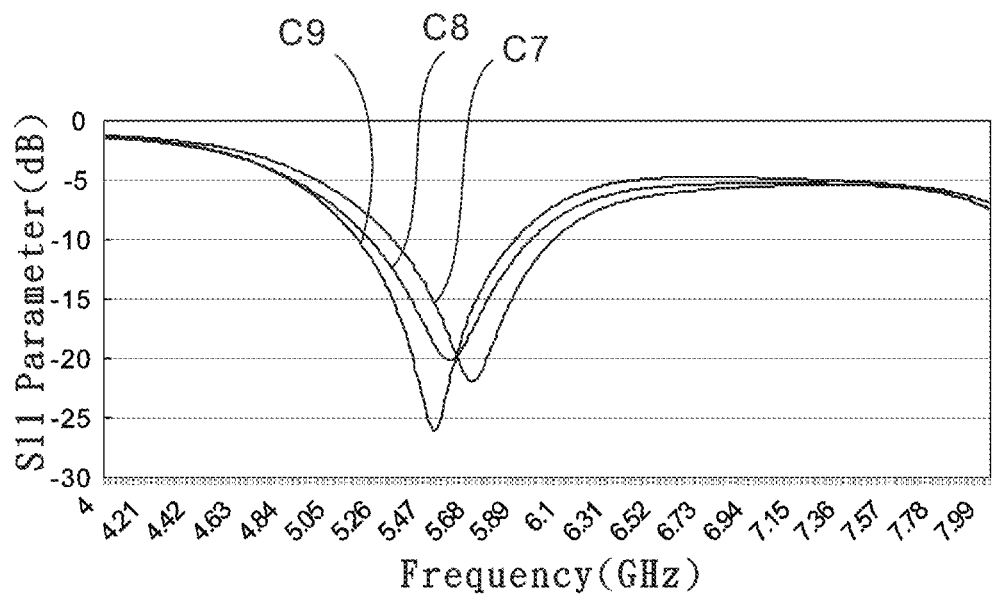
FIG. 4c shows the frequency responses of $S_{11}$ parameter of the MIMO antenna device with respect to different lengths of the third strip.

FIG. 4c shows the frequency responses of the $S_{11}$ parameter of the MIMO antenna device with respect to different lengths of the third strip 123. Based on the operational frequency of 5.1 GHz to 5.85 GHz, line C7 represents the frequency response of the $S_{11}$ parameter of the MIMO antenna device when the length of the third strip 123 is set as 1.6 mm, line C8 represents the frequency response of the $S_{11}$ parameter when the length of the third strip 123 is set as 1.7 mm, and line C9 represents the frequency response of the $S_{11}$ parameter when the length of the third strip 123 is set as 1.8 mm. The bandwidths of lines C7, C8 and C9 can be determined based on the difference in operational frequency when the $S_{11}$ value is at −10 dB. It can be recognized from FIG. 4c that the operational frequency can be changed by adjusting the length of the third strip 123. In FIG. 4c, the preferred length of the third strip 123 is 1.8 mm.

Figure 4D:
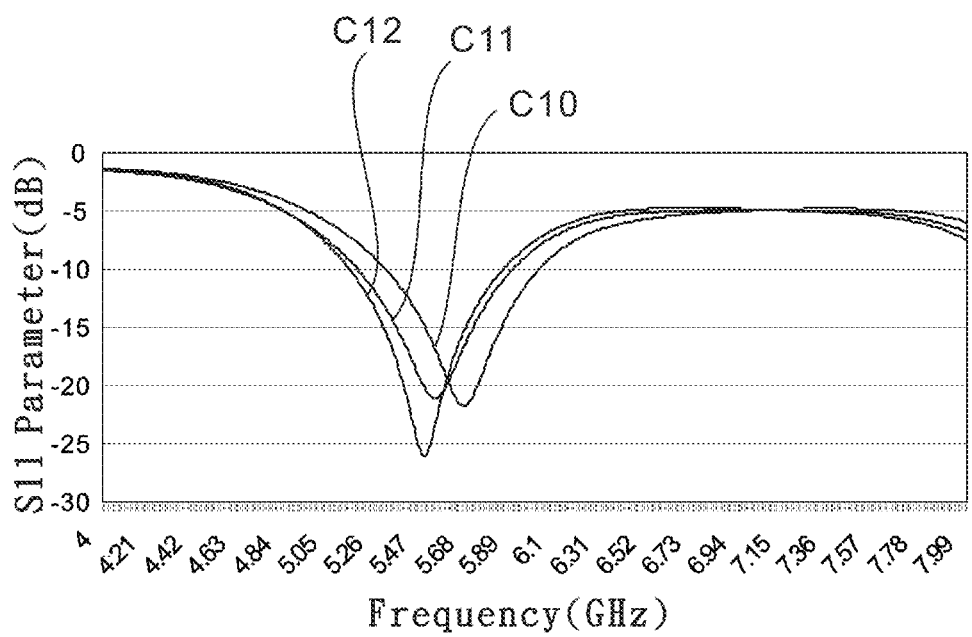
FIG. 4d shows the frequency responses of $S_{11}$ parameter of the MIMO antenna device with respect to different lengths of the fourth strip.

FIG. 4d shows the frequency responses of the $S_{11}$ parameter of the MIMO antenna device with respect to different lengths of the fourth strip 124. Based on the operational frequency of 5.1 GHz to 5.85 GHz, line C10 represents the frequency response of the $S_{11}$ parameter of the MIMO antenna device when the length of the fourth strip 124 is set as 0.6 mm, line C11 represents the frequency response of the $S_{11}$ parameter when the length of the fourth strip 124 is set as 0.7 mm, and line C12 represents the frequency response of the $S_{11}$ parameter when the length of the fourth strip 124 is set as 0.8 mm. The bandwidths of individual lines C10 to C12 can be determined based on the difference in operational frequency when the $S_{11}$ value is at −10 dB. It can be seen from FIG. 4d that the operational frequency can be changed by adjusting the length of the fourth strip 124. In FIG. 4d, the preferred length of the fourth strip 124 is 0.8 mm.

Figure 5:
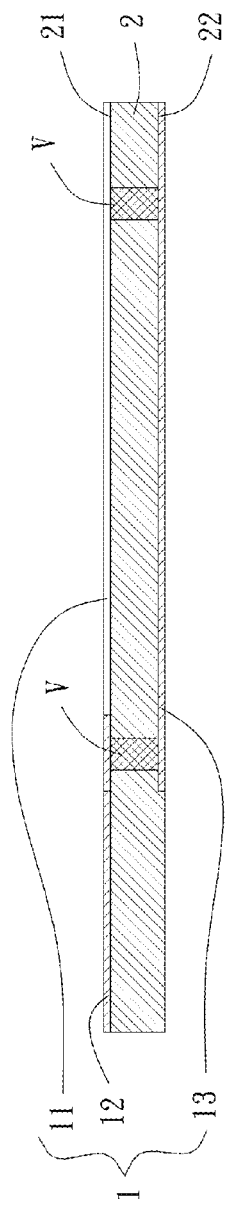
FIG. 5 is a cross-sectional view of the MIMO antenna device taken along line A-A of FIG. 2.

The second end (end E2) of the fourth strip 124 can be electrically connected to the ground unit 13 through a conducting member V and a conducting pad P. The conducting member V extends from the surface 21 to the surface 22 as shown in FIG. 5. The conducting pad P is disposed on the same surface 21 of the radiation unit 12.

Referring to FIGS. 1 and 3, the antenna 1 may further include an impedance adjustment unit 14 positioned in the rectangular region A. The impedance adjustment unit 14 partially extends away from the top portion 112 in a direction perpendicular to the top portion 112, and partially extends parallel to the top portion 112 towards the gap B. In this embodiment, the impedance adjustment unit 14 includes a first section 141 and a second section 142. The first section 141 is connected between the first strip 121 and the second section 142 and is perpendicular to the first strip 121 and the second section 142. The second section 142 extends towards the fourth strip 124. In this embodiment, the frequency responses of the $S_{11}$ parameter with and without the arrangement of the impedance adjustment unit 14 are compared under the operational frequency of 5.1 GHz to 5.85 GHz.

Figure 4E:
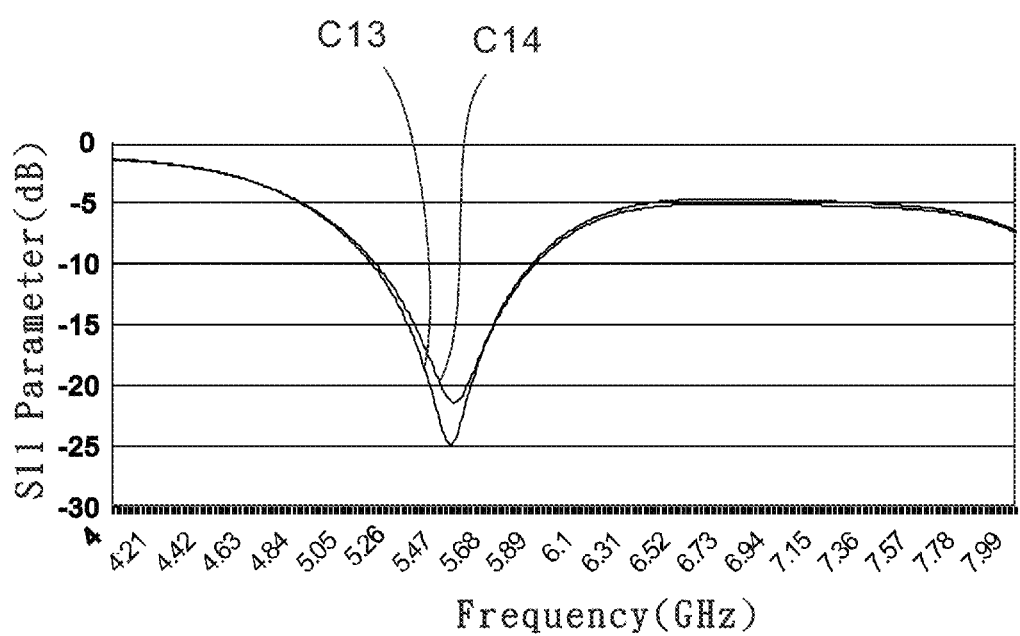
FIG. 4e shows the frequency responses of $S_{11}$ parameter of the MIMO antenna device with and without arrangement of the impedance adjustment unit.

FIG. 4e shows the frequency responses of the $S_{11}$ parameter of the MIMO antenna device with and without the arrangement of the impedance adjustment unit 14. Line C13 represents the frequency response of the $S_{11}$ parameter of the MIMO antenna device at the operational frequency of 5.1 GHz to 5.85 GHz when the impedance adjustment unit 14 is arranged. Line C14 represents the frequency response of the $S_{11}$ parameter at the same operational frequency when the impedance adjustment unit 14 is not arranged. It can be recognized from FIG. 4e that, when the impedance adjustment unit 14 is arranged, the signal reflection of the antennas 1 ($S_{11}$) can be reduced without increasing the areas of the antennas 1. In addition, the signal reflection of the antennas 1 can be properly adjusted by changing the lengths of the first section 141 and the second section 142.

Referring to FIGS. 1 to 3, the ground unit 13 is arranged along two sides of the strip portion 111 of the T-shaped feeding unit 11. Preferably, the ground unit 13 is arranged along two sides of the thick section 1111 of the strip portion 111 in order not to affect the signal transmission of the thin section 1112. The ground units 13 of two adjacent antennas 1 are electrically connected to each other. The ground unit 13 and the T-shaped feeding unit 11 are preferably disposed on separate surfaces of the substrate 2 in order to maintain outstanding insulation therebetween. This prevents the insulation between the ground unit 13 and the T-shaped feeding unit 11 from being affected by factors such as unstable production yield rate or the like. However, the ground unit 13 and the T-shaped feeding unit 11 may also be disposed on the same surface of the substrate 2 if such factors can be handled. In this embodiment, the ground unit 13 and the T-shaped feeding unit 11 are disposed on separate surfaces 21 and 22 of the substrate 2. The ground unit 13 includes a first ground section 131 and a second ground section 132 that are arranged in parallel along two sides of the strip portion 111. The first ground section 131 is electrically connected to the second end E2 of the fourth strip 124, the second ground section 132 is electrically connected to the second ground section 132 of another ground unit 13. The ground unit 13 may further include a plurality of ground pads 133 that can be electrically connected to other ground conductors by ways of surface contact, wire bonding or welding. The ground pads 133 and the strip portion 111 are arranged on the same surface 21 of the substrate 2. Each ground pad 133 is aligned with a corresponding ground section 131 or 132. Specifically, referring to FIG. 2, a portion of the ground pads 133 and the first ground section 131 are arranged on one side of the strip portion 111, whereas the other portion of the ground pads 133 and the second ground section 132 are arranged on the other side of the strip portion 111. In the example of FIG. 2, for the antenna 1a, two ground pads 133 are arranged on the left side of the strip portion 111, whereas only one ground pad 133 is arranged on the right side of the strip portion 111. The two ground pads 133 on the left side of the strip portion 111 are electrically connected to the first ground section 131 via two conducting members V. The single ground pad 133 on the right side of the strip portion 111 is electrically connected to the second ground section 131 via one conducting member V. Similarly, for the antenna 1b, two ground pads 133 are arranged on the right side of the strip portion 111, whereas only one ground pad 133 is arranged on the left side of the strip portion 111. The two ground pads 133 on the right side of the strip portion 111 are electrically connected to the first ground section 131 via two conducting members V. The single ground pad 133 on the left side of the strip portion 111 is electrically connected to the second ground section 131 via one conducting member V.

Figure 6:
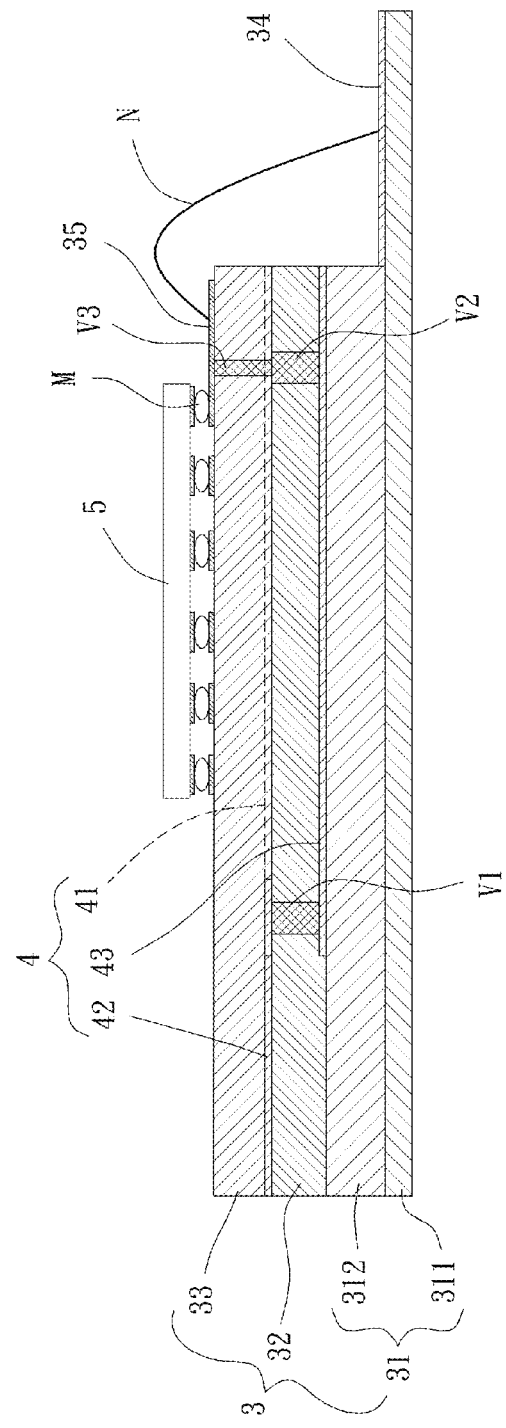
FIG. 6 is a cross-sectional view of an antenna package receiving at least one antenna.
Figure 7:
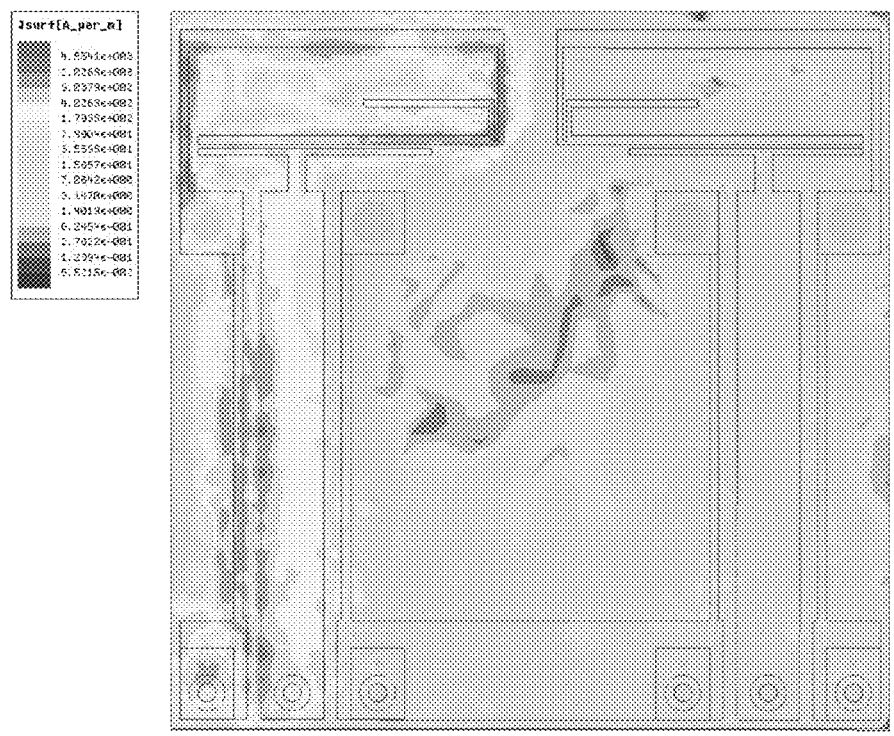
FIG. 7 shows the distribution of the electromagnetic field of the MIMO antenna device.

Referring to FIG. 6, a cross-sectional view of an antenna package is shown according to a preferred embodiment of the invention. The antenna package includes a carrying unit 3, at least one antenna 4 and at least one circuit unit 5. The antenna 4 is received in the carrying unit 3. The circuit unit 5 is mounted on the carrying unit 3 and electrically connected to the antenna 4.

The carrying unit 3 includes a base plate 31, a substrate 32 and a cover plate 33. The base plate 31 may consist of a PCB material layer 311 (such as a ceramic substrate, a laminated board, a glass substrate, etc) and an insulation material layer 312 (such as glass, silicon dioxide, etc) being stacked with the PCB material layer 311. The substrate 32 and the cover plate 33 are made of substantially the same material with the substrate 2. The base plate 31, the substrate 32 and the cover plate 33 are stacked with one another in order. Therefore, the substrate 32 is sandwiched between the base plate 31 and the cover plate 33 in order for the antenna 4 to be arranged thereon. The base plate 31 has a first ground pad 34, the cover plate 33 has a second ground pad 35 electrically connected to the first ground pad 34 via, for example, a bonding wire N.

The antenna 4 has a T-shaped feeding unit 41, a radiation unit 42 and a ground unit 43. The T-shaped feeding unit 41 and the radiation unit 42 are sandwiched between the substrate 32 and the cover plate 33. The ground unit 43 is sandwiched between the substrate 32 and the base plate 31. The T-shaped feeding unit 41, the radiation unit 42 and the ground unit 43 are substantially identical to the T-shaped feeding unit 11, the radiation unit 12 and the ground unit 13 of the antenna 1, so they are not described herein again for brevity.

The area between two T-shaped feeding units 41 of two adjacent antennas 4 also experiences a relatively weaker electromagnetic field (see FIG. 2). The circuit unit 5 experiences a lesser extent of electromagnetic interference when the circuit unit 5 is disposed in the area. In this embodiment, the radiation unit 42 is electrically connected to the ground unit 43 via a first conducting member V1. The ground unit 43 is electrically connected to the second ground pad 35 via a plurality of second conducting members V2 and a plurality of third conducting members V3. The first conducting member V1 and the second conducting members V2 extend through the substrate 32. The third conducting members V3 extend through the cover plate 33.

The circuit unit 5, which includes components such as integrated circuits or passive elements, is mounted on the cover plate 33 of the carrying unit 3. Preferably, the circuit unit 5 is mounted in the area that has a relatively weaker electromagnetic field, so as to minimize the electromagnetic interference between the circuit unit 5 and the antenna 4. The circuit unit 5 is electrically connected to the second ground pad 35 of the carrying unit 3 and the ground unit 43 of the antenna 4 via, for example, a welding material M.

Figure 8:
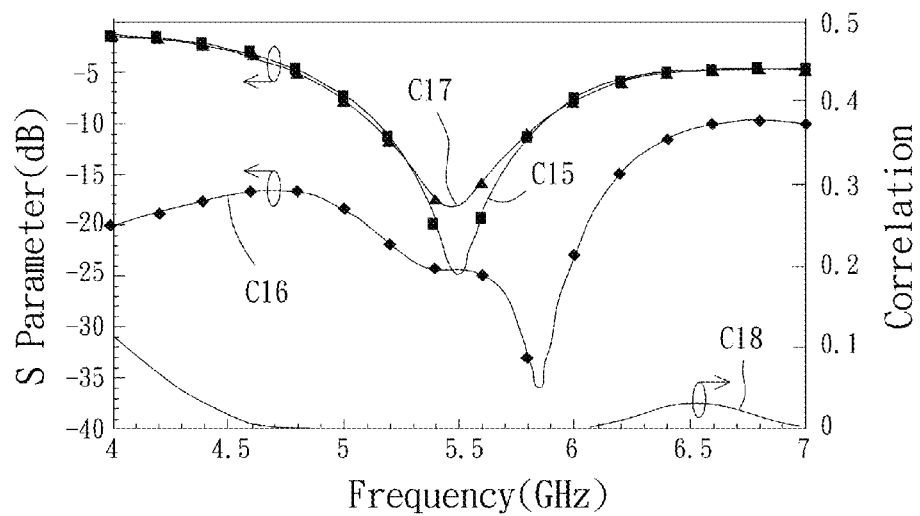
FIG. 8 shows the measured scattering parameters of the MIMO antenna device.

FIG. 8 shows individual scattering parameters of the antennas 1. It is noted that two antennas 1 are provided when the scattering parameters of the antennas 1 are measured. Line C15 represents the $S_{11}$ parameter of the antennas 1, line C16 represents the $S_{21}$ parameter of the antennas 1, line C17 represents the $S_{22}$ parameter of the antennas 1, and line 18 represents the envelop correlation coefficient (ECC) of the antennas 1. It can be seen from the lines C15 and C17 that, when both the $S_{11}$ and $S_{22}$ parameters of the antennas 1 are at −10 dB, the corresponding operational frequencies of the antennas 1 are 5.13 GHz and 5.86 GHz respectively. One having ordinary skill in the art may readily appreciate that more than 90% of energy can be fed into the antennas 1 when the $S_{11}$ parameter of the antennas 1 is at −10 dB or lower. Thus, it has been a well known fact to one skilled in the art that the antenna performance can be evaluated by determining whether the $S_{11}$ value of the antennas is at −10 dB or lower. Based on this, it is determined that the antennas 1 have an outstanding refection coefficient.

Furthermore, it can also be seen from the line C16 that the coupling coefficient of the antennas 1 is always lower than −15 dB when the operational frequency is within the range of 5.13 GHz to 5.86 GHz. One having ordinary skill in the art may appreciate that the $S_{21}$ value represents the coupling coefficient of the antennas 1. The larger the coupling coefficient the larger the amount of energy that can be coupled from one to the other antenna 1. Thus, it has been a well known knowledge to one skilled in the art that the antenna performance can be evaluated by determining whether the $S_{21}$ value of the antennas is at −15 dB or lower. Based on this, it is determined that the antennas 1 have an outstanding coupling coefficient.

Moreover, it can be seen from C18 that the ECC of the antennas 1 is always lower than 0.5 when the operational frequency is within the range of 5.13 GHz to 5.86 GHz. One having ordinary skill in the art may readily appreciate that the signal coupling of the antennas 1 might be interfered. In this situation, the ECC of the antennas 1 is also affected. The higher the ECC of the antennas 1 the lower the data transmission rate of the antennas 1. The acceptable antenna ECC is 0.5 or below. Thus, it is determined that the antennas 1 have an outstanding coupling coefficient.

Figure 9:
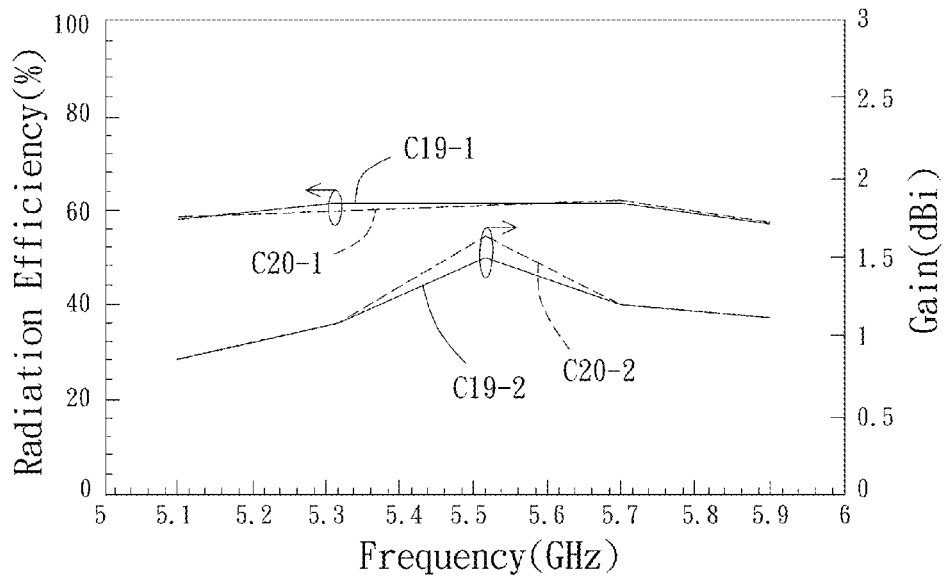
FIG. 9 shows the radiation efficiency and gain diagrams of the MIMO antenna device.

FIG. 9 shows the radiation efficiency and gain of the antennas 1 according to the preferred embodiment of the invention. Lines C19-1 and C20-1 represent the radiation efficiency of the antennas 1, lines C19-2 and C20-2 represent the gain of the antennas 1. It can be seen from lines C19-1 and C20-1 that the antennas 1 have approximately 60% of radiation efficiency. Thus, it has been verified that the antennas 1 have outstanding radiation efficiency.

It can also be seen from lines C19-2 and C20-2 that the peak gain of the antennas 1 is approximately 1.5 dBi. Since the gain is proportional to the radiation efficiency, the larger the gain the higher the radiation efficiency. This, it is verified that the antennas 1 have an outstanding peak gain.

Although the antennas 1 are exemplarily used to measure the scattering parameters, the radiation efficiency along with the gain as shown in FIGS. 8 and 9, it is understood that the results in FIGS. 8 and 9 also apply to the antennas 4, as the antennas 4 are structurally identical to the antennas 1.

In the structures of the antennas 1, 4, the T-shaped feeding unit forms a strip portion and a top portion on a first surface of the substrate, the radiation unit has first and second ends and extends from the first end to the second end in a labyrinthine manner to form a rectangular region and a gap. In addition, the radiation unit partially extends parallel to the top portion, the ground unit is electrically connected to the second end of the radiation unit. In addition, the ground unit is disposed on the second surface of the substrate and arranged along two sides of the strip portion. In the above arrangement, energy can be coupled from the feeding unit to the radiation unit, achieving outstanding antenna isolation without usage of isolation devices. In addition, in the structures of the antennas 1, 4, the areas of the antennas 1, 4 may be independent from the operational frequency due to the fact that the energy can be coupled from the T-shaped feeding unit to the radiation unit. As a result, antenna miniaturization may be achieved and therefore cost is reduced. Moreover, the operational frequency of the antennas can be adjusted by simply changing the geometrical structures of the T-shaped feeding unit and the radiation unit without using the match circuit. Thus, convenient adjustment of operational frequency is achieved.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. An antenna package comprising:
a carrying unit comprising a base plate, a substrate and a cover plate being stacked, wherein the base plate has a first ground pad, and wherein the cover plate has a second ground pad electrically coupled to the first ground pad;

at least one antenna, wherein each of the at least one antenna comprises a T-shaped feeding unit, a radiation unit and a ground unit, wherein the T-shaped feeding unit and the radiation unit are sandwiched between the substrate and the cover plate, wherein the T-shaped feeding unit forms a strip portion and a top portion, wherein the radiation unit has a first end and a second end, wherein the radiation unit extends from the first end to the second end to form a rectangular region and a spacing, wherein the first end of the radiation unit extends parallel to the top portion of the T-shaped feeding unit, wherein the ground unit is disposed along two sides of the strip portion, and wherein the ground unit is electrically coupled to the second end of the radiation unit and the second ground pad of the carrying unit; and at least one circuit unit mounted on the cover plate and electrically coupled to the second ground pad of the carrying unit and the ground unit of each antenna.

2. The antenna package as claimed in claim 1, wherein the at least one antenna comprises two antennas symmetrically disposed on a substrate having first and second surfaces, wherein the T-shaped feeding unit and the radiation unit of each antenna are disposed on the first surface of the surfaces, wherein the two strip portions of the two T-shaped feeding units are parallel to and aligned with each other, and wherein the two ground units of the two antennas are electrically connected to each other.

3. The antenna package as claimed in claim 1, wherein each of the at least one antenna further comprises an impedance adjustment unit positioned in the rectangular region, wherein the impedance adjustment unit comprises a first section and a second section, wherein the first section extends away from the top portion in a direction perpendicular to the top portion, and wherein the second section extends parallel to the top portion towards the spacing.

4. The antenna package as claimed in claim 1, wherein the radiation unit is spaced from the top portion by a coupling gap.

5. The antenna package as claimed in claim 1, wherein the strip portion has a thick section and a thin section, and wherein the thin section is connected between the thick section and the top portion.

6. The antenna package as claimed in claim 1, wherein the radiation unit comprises a first strip, a second strip, a third strip and a fourth strip, wherein the first strip, the second strip, the third strip and the fourth strip jointly form the rectangular region, and wherein the first strip and the fourth strip are spaced from each other by the spacing.

7. The antenna package as claimed in claim 6, wherein each of the at least one antenna further comprises an impedance adjustment unit positioned in the rectangular region, wherein the impedance adjustment unit comprises a first section and a second section, wherein the first section is connected between the first strip and the second section and is perpendicular to the first strip and the second section, and wherein the second section extends towards the fourth strip.

8. The antenna package as claimed in claim 6, wherein the first strip is spaced from the top portion by a coupling gap.

9. The antenna package as claimed in claim 2, wherein the radiation unit comprises a first strip, a second strip, a third strip and a fourth strip, wherein the first strip, the second strip, the third strip and the fourth strip jointly form the rectangular region, and wherein the first strip and the fourth strip are spaced from each other by the spacing, wherein the two second strips of the two radiation units are spaced from each other by a predetermined distance.

10. The antenna package as claimed in claim 1, wherein the ground unit comprises first and second ground sections arranged in parallel along two sides of the strip portion, and wherein the first ground section is electrically coupled to the radiation unit.

11. The antenna package as claimed in claim 2, wherein the ground unit comprises a plurality of ground pads, a first ground section and a second ground section, wherein the ground pads are disposed on the first surface of the substrate, wherein the first and second ground sections are disposed on a second surface of the substrate and arranged in parallel along two sides of the strip portion, wherein each ground pad is aligned with a corresponding one of the first and second ground sections, wherein a portion of the ground pads and the first ground section are electrically coupled with each other and arranged on one side of the strip portion, and wherein an other portion of the ground pads and the second ground section are electrically coupled with each other and arranged on an other side of the strip portion.

12. The antenna package as claimed in claim 2, wherein the radiation unit is electrically coupled to the ground unit via a first conducting member, wherein the ground unit is electrically coupled to the second ground pad via a plurality of second conducting members and a plurality of third conducting members, wherein the first conducting member and the second conducting members extend through the substrate, and wherein the third conducting members extend through the cover plate.

* * * * *